(12) United States Patent
Jhung

(10) Patent No.: US 12,081,196 B2
(45) Date of Patent: Sep. 3, 2024

(54) RADIO-FREQUENCY CIRCUITS AND DEVICES HAVING HARMONIC SUPPRESSION

(71) Applicant: SKYWORKS GLOBAL PTE. LTD., Singapore (SG)

(72) Inventor: Jae Myoung Jhung, Seoul (KR)

(73) Assignee: SKYWORKS GLOBAL PTE. LTD., Singapore (SG)

( * ) Notice: Subject to any disclaimer, the term of this patent is extended or adjusted under 35 U.S.C. 154(b) by 0 days.

(21) Appl. No.: 18/129,891

(22) Filed: Apr. 2, 2023

(65) Prior Publication Data

US 2023/0318569 A1 Oct. 5, 2023

Related U.S. Application Data

(63) Continuation of application No. 17/015,379, filed on Sep. 9, 2020, now Pat. No. 11,621,697.

(60) Provisional application No. 62/897,953, filed on Sep. 9, 2019.

(51) Int. Cl.
*H03H 9/54* (2006.01)
*H03H 9/02* (2006.01)
*H03H 9/56* (2006.01)
*H03H 9/70* (2006.01)

(52) U.S. Cl.
CPC ........ *H03H 9/547* (2013.01); *H03H 9/02031* (2013.01); *H03H 9/562* (2013.01); *H03H 9/568* (2013.01); *H03H 9/706* (2013.01)

(58) Field of Classification Search
CPC .... H03H 9/547; H03H 9/02031; H03H 9/562; H03H 9/568; H03H 9/706; H03H 9/725
USPC .......................... 333/133, 187, 188, 193–196
See application file for complete search history.

(56) References Cited

U.S. PATENT DOCUMENTS

2015/0236840 A1* 8/2015 Link ...................... H03H 9/706
370/281

* cited by examiner

*Primary Examiner* — Rakesh B Patel
*Assistant Examiner* — Jorge L Salazar, Jr.
(74) *Attorney, Agent, or Firm* — Chang & Hale LLP

(57) ABSTRACT

In some embodiments, a radio-frequency circuit or device can include a filter circuit having an input node and an output node. The filter circuit can further include a first assembly having one or more bulk acoustic wave resonators implemented electrically between the input node and the output node, and configured to filter a signal. The filter circuit can further include a second assembly having one or more surface acoustic wave resonators implemented electrically relative to the first assembly, and configured to suppress one or more harmonics resulting from the filtering of the signal by the first assembly.

19 Claims, 7 Drawing Sheets

RADIO-FREQUENCY CIRCUITS AND DEVICES HAVING HARMONIC SUPPRESSION

CROSS-REFERENCE TO RELATED APPLICATION(S)

This application is a continuation of U.S. application Ser. No. 17/015,379 filed Sep. 9, 2020, entitled HARMONIC SUPPRESSION IN BULK ACOUSTIC WAVE DUPLEXER, which claims priority to and the benefit of the filing date of U.S. Provisional Application No. 62/897,953 filed Sep. 9, 2019, entitled HARMONIC SUPPRESSION IN BULK ACOUSTIC WAVE DUPLEXER, the benefits of the filing dates of which are hereby claimed and the disclosures of which are hereby expressly incorporated by reference herein in their entirety.

BACKGROUND

Field

The present disclosure relates to bulk acoustic wave (BAW) devices such as duplexers.

Description of the Related Art

In radio-frequency applications, bulk acoustic wave (BAW) devices can be utilized as filter devices. In some embodiments, such BAW filters can be implemented in duplexers.

SUMMARY

In accordance with some implementations, the present disclosure relates to a filter circuit that includes an input node and an output node, and a first assembly having one or more bulk acoustic wave (BAW) resonators implemented electrically between the input node and the output node, and configured to filter a signal. The filter circuit further includes a second assembly having one or more surface acoustic wave (SAW) resonators implemented electrically relative to the first assembly, and configured to suppress one or more harmonics resulting from the filtering of the signal by the first assembly.

In some embodiments, the first assembly can be configured as a band-pass filter with a frequency band about a center frequency $f_0$. The second assembly can be configured to suppress a second harmonic having a frequency of $2f_0$. The second assembly can be configured as a notch filter with a frequency band about the second harmonic frequency $2f_0$.

In some embodiments, the second assembly can be implemented electrically between the first assembly and the output node. The first assembly can include a series path having a plurality of BAW resonators electrically arranged in series between the input node and the second assembly. The first assembly can further include one or more BAW resonators each electrically arranged as a shunt path between a respective node along the series path and ground.

In some embodiments, the first assembly and the second assembly can be configured to support a transmit operation, and the signal can be a power-amplified signal. The output node can be an antenna node. The filter circuit can further include a third assembly having one or more bulk acoustic wave (BAW) resonators implemented electrically between the antenna node and a receive node, and be configured to filter a received signal from the antenna node. The first assembly and the third assembly can be configured to provide duplexing functionality.

In a number of implementations, the present disclosure relates to a duplexer that includes an antenna node, a transmit node, and a receive node. The duplexer further includes a transmit filter implemented to be electrically between the transmit node and the antenna node, and configured to filter a power-amplified signal. The transmit filter includes one or more bulk acoustic wave (BAW) resonators. The duplexer further includes a receive filter implemented to be electrically between the antenna node and the receive node, and configured to filter a received signal. The receive filter includes one or more BAW resonators, with at least one of the transmit filter and the receive filter further including a surface acoustic wave (SAW) resonator implemented electrically relative to the one or more BAW resonators of the respective filter, and configured to suppress one or more harmonics resulting from the filtering of the respective signal.

In some embodiments, the SAW resonator can be implemented to be electrically between the one or more BAW resonators of the transmit filter and the antenna node to suppress the one or more harmonics resulting from the filtering of the power-amplified signal. The one or more harmonics resulting from the filtering of the power-amplified signal can include a second harmonic.

In some teachings, the present disclosure relates to a filter device that includes a substrate and a filter circuit implemented on the substrate. The filter circuit includes an input node and an output node. The filter circuit further includes a first assembly having one or more bulk acoustic wave (BAW) resonators implemented electrically between the input node and the output node, and configured to filter a signal. The filter circuit further includes a second assembly having one or more surface acoustic wave (SAW) resonators implemented electrically relative to the first assembly, and configured to suppress one or more harmonics resulting from the filtering of the signal by the first assembly.

In some embodiments, each BAW resonator can include a piezoelectric material layer implemented between a lower electrode and an upper electrode. In some embodiments, the lower electrode can be on an upper surface of the substrate.

In some embodiments, each SAW resonator can include a piezoelectric material layer implemented over the substrate, and an interdigital transducer structure implemented over the piezoelectric material layer. In some embodiments, the piezoelectric material layer of the SAW resonator and the piezoelectric material layer of the BAW resonator can be formed from substantially the same material. In some embodiments, the piezoelectric material layer of the SAW resonator can be implemented directly on an upper surface of the substrate. In some embodiments, the piezoelectric material layer of the SAW resonator can be implemented on a metal layer which is on an upper surface of the substrate. In some embodiments, each of the piezoelectric material layer of the SAW resonator and the piezoelectric material layer of the BAW resonator can include aluminum nitride.

In some embodiments, the first assembly and the second assembly can be configured to support a transmit operation, and the signal is a power-amplified signal. The output node can be an antenna node. In some embodiments, the filter device can further include a third assembly having one or more bulk acoustic wave (BAW) resonators implemented electrically between the antenna node and a receive node, and configured to filter a received signal from the antenna node. The first assembly and the third assembly can be configured to provide duplexing functionality.

In some implementations, the present disclosure relates to a radio-frequency module that includes a packaging substrate configured to receive and support a plurality of components, and a die mounted on the packaging substrate and including a radio-frequency integrated circuit. The radio-frequency module further includes a filter device mounted on the packaging substrate and configured to support operation of the radio-frequency integrated circuit. The filter device includes a filter substrate and a filter circuit implemented on the filter substrate. The filter device further includes a first assembly having one or more bulk acoustic wave (BAW) resonators implemented electrically between an input node and an output node, and configured to filter a signal. The filter device further includes a second assembly having one or more surface acoustic wave (SAW) resonators implemented electrically relative to the first assembly, and configured to suppress one or more harmonics resulting from the filtering of the signal by the first assembly.

According to some implementations, the present disclosure relates to a wireless device that includes an antenna and a front-end system in communication with the antenna. The front-end system includes a filter circuit having an input node and an output node. The filter circuit further includes a first assembly having one or more bulk acoustic wave (BAW) resonators implemented electrically between the input node and the output node, and configured to filter a signal. The filter circuit further includes a second assembly having one or more surface acoustic wave (SAW) resonators implemented electrically relative to the first assembly, and configured to suppress one or more harmonics resulting from the filtering of the signal by the first assembly.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
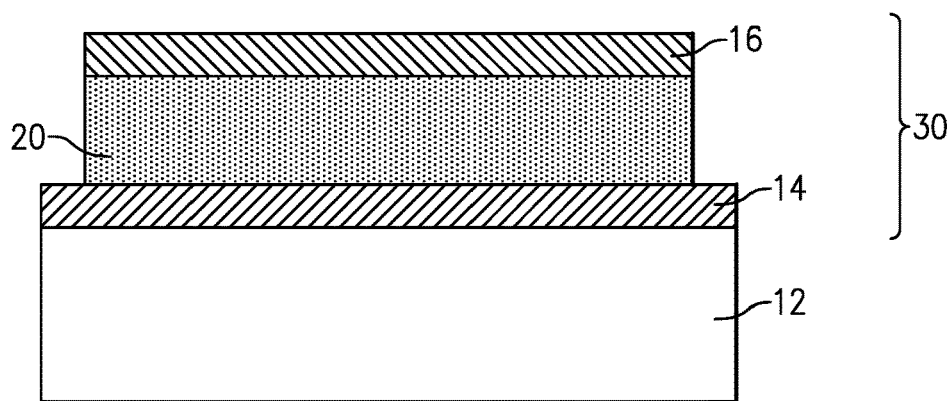
FIG. 1 depicts a side view of a bulk acoustic wave (BAW) resonator implemented on a substrate.

Described herein are various examples related to bulk acoustic wave (BAW) filter devices such as duplexers. FIG. 1 depicts a side view of a BAW resonator 30 implemented on a substrate 12. Such a BAW resonator can be formed by positioning a piezoelectric material layer 20 between a first electrode (e.g., upper electrode 16) and a second electrode (e.g., lower electrode 14). If a radio-frequency (RF) signal is applied to the resonator 30 through one of the electrodes, a corresponding acoustic wave is propagated through the piezo layer 20 towards the other electrode and leaves that electrode as an RF signal corresponding to the frequency of the acoustic wave. Thus, the BAW resonator 30 can provide an excellent filtering functionality.

Figure 2:
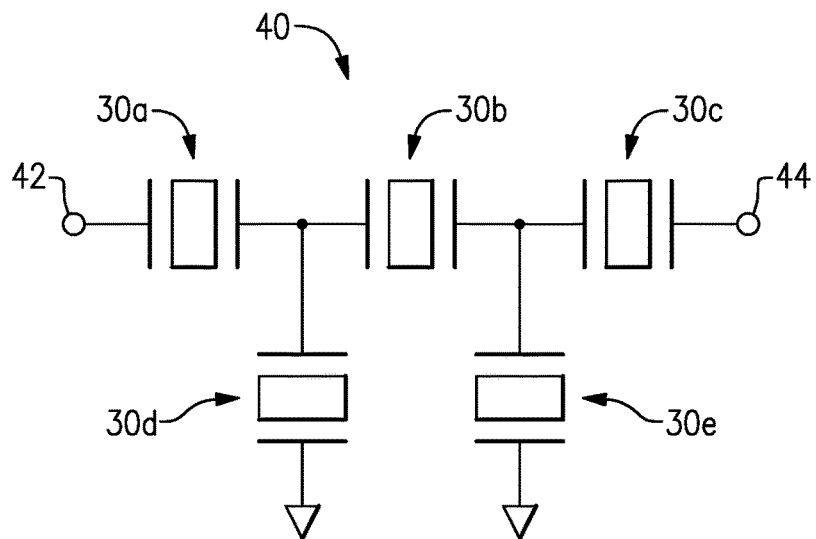
FIG. 2 shows an example of a filter that can be implemented using a plurality of BAW resonators such as the BAW resonator of FIG. 1.

FIG. 2 shows an example of a filter 40 that can be implemented using a plurality of BAW resonators such as the BAW resonator 30 of FIG. 1. In the example of FIG. 2, the filter 40 is shown to include first and second nodes 42, 44. The first node 42 can be, for example, an input node for an RF signal, and the second node 44 can be an output node for the filtered RF signal.

The example filter 40 is shown to include three BAW resonators 30a, 30b, 30c electrically arranged in series between the first and second nodes 42, 44. It will be understood that a filter can include more or less number of series resonators.

The example filter 40 is also shown to include two BAW resonators 30d, 30e each electrically arranged to provide a shunt coupling from a respective node along the series path to ground. More particularly, the BAW resonator 30d is shown to provide a shunt coupling from a node between the series BAW resonators 30a, 30b to ground, and the BAW resonator 30e is shown to provide a shunt coupling from a node between the series BAW resonators 30b, 30c to ground. It will be understood that a filter can include more or less number of shunt resonators.

It is noted that for a BAW resonator based filter, such as the example filter 40 of FIG. 2, a significant amount of one or more harmonics can arise when the filter is provided with a signal having a frequency $f_0$. For example, suppose that the filter 40 of FIG. 2 is configured to provide a band-pass filter functionality with a center frequency of $f_0$. One or more harmonics can arise based on the center frequency of $f_0$ (e.g., $2f_0$, $3f_0$, etc.); and if a harmonic is sufficiently large, it can cause problems in one or more circuits associated with the filter 40.

Figure 3:
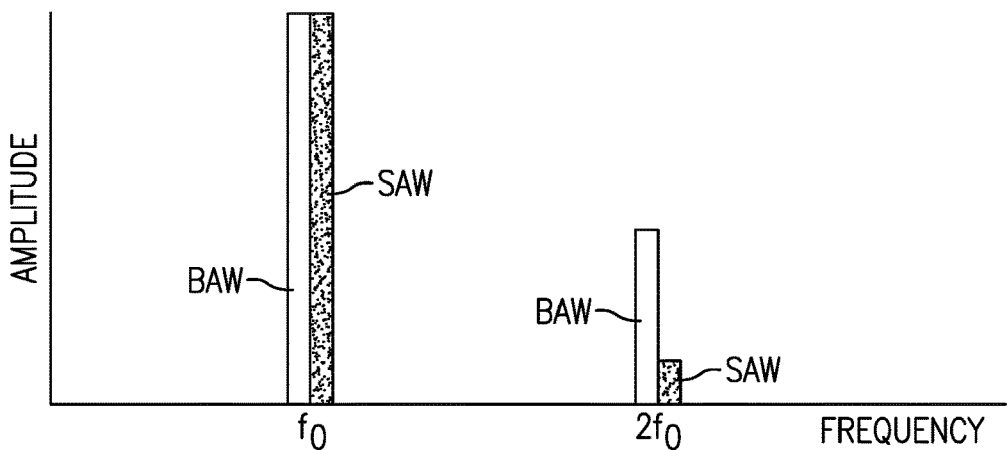
FIG. 3 depicts an amplitude distribution that can arise from use of the filter of FIG. 2.

For example, FIG. 3 depicts an amplitude distribution that can arise from use of the filter 40 of FIG. 2. As described above, suppose that the filter 40 of FIG. 2 is implemented with a center frequency of $f_0$. Accordingly, amplitude of a filtered signal at $f_0$ is depicted as having a given amplitude ("BAW" bar at $f_0$). FIG. 3 further shows that a second harmonic ($2f_0$) can have a relatively large amplitude ("BAW" bar at $2f_0$).

In some embodiments, a BAW based filter having one or more features as described herein can include one or more resonators implemented to remove or reduce one or more harmonics associated with the BAW based filter. By way of an example, and as further shown in FIG. 3, it is noted that a surface acoustic wave (SAW) filter having similar functionality as the BAW filter 40 of FIG. 2 has a relatively smaller amplitude harmonics when compared to those associated with the BAW filter 40. In FIG. 3, the second harmonic ($2f_0$) associated with such a SAW filter is shown to have a relatively small amplitude ("SAW" bar at $2f_0$) when compared to the BAW filter's second harmonic amplitude.

In some embodiments, the foregoing phenomenon of the SAW filter having smaller amplitude harmonic(s) may be due to the IDT (interdigital transducer) structure of the SAW filter. Thus, such a feature can be utilized to suppress one or more harmonics associated with a BAW filter.

Figure 4:
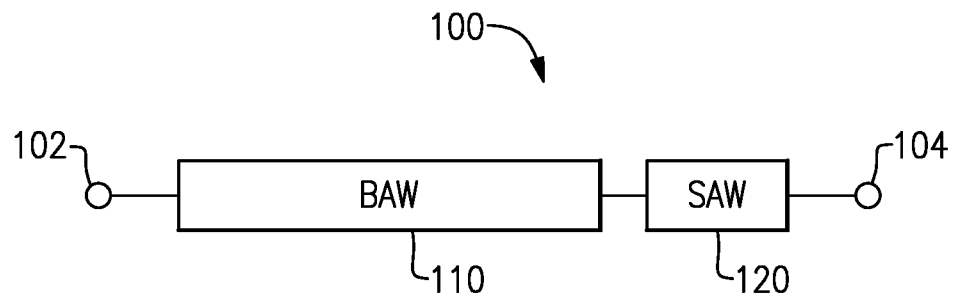
FIG. 4 shows that in some embodiments, a filter can include first and second nodes, and an assembly of one or more BAW resonators implemented between the first and second nodes.

For example, FIG. 4 shows that in some embodiments, a filter 100 can include first and second nodes 102, 104, and an assembly 110 of one or more BAW resonators implemented between the first and second nodes 102, 104. For the purpose of description, such an assembly of BAW resonators can be, for example, the series and shunt BAW resonators of FIG. 2.

In some embodiments, an assembly 120 of one or more SAW resonators can be implemented on an output side of the BAW assembly 110. In such a configuration, a harmonic such as a second harmonic resulting from the filtering achieved in the BAW assembly 110 can be suppressed by the SAW assembly 120. Thus, in the example of FIG. 4, if the first node 102 is an input node and the second node 104 is an output node, the SAW assembly 120 can be implemented on the output node side of the BAW assembly 110.

Figure 5:
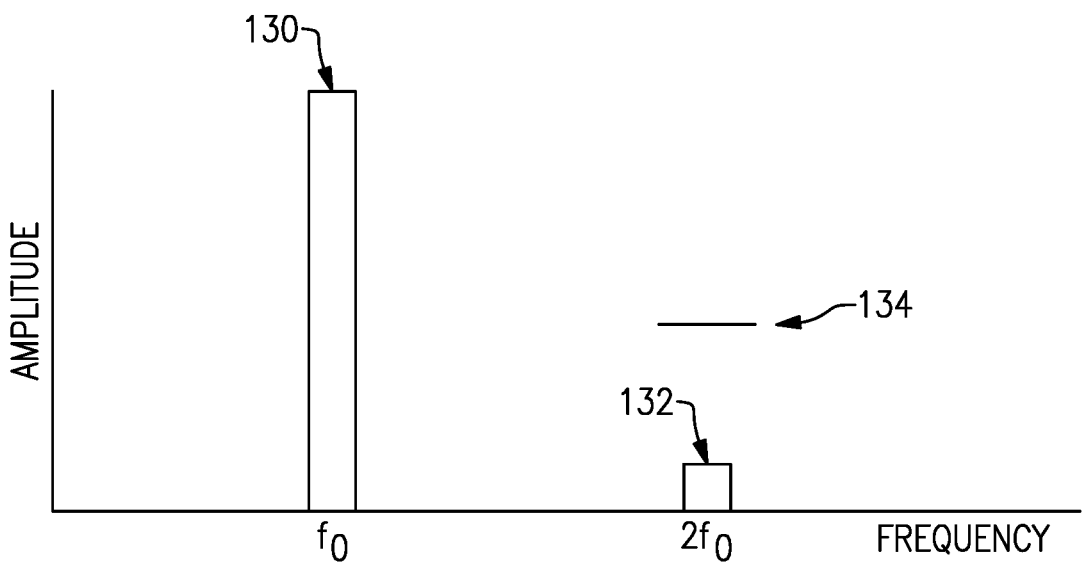
FIG. 5 depicts an amplitude distribution that can arise from use of the filter of FIG. 4.

Configured in the foregoing manner, the filter 100 can have one or more of its harmonics suppressed. For example, FIG. 5 depicts an amplitude distribution that can arise from use of the filter 100 of FIG. 4. Suppose that the filter 100 of FIG. 4 is implemented with a center frequency of $f_0$. Accordingly, amplitude of a filtered signal at $f_0$ is depicted as having a given amplitude 130. FIG. 5 further shows that a second harmonic ($2f_0$) can have a suppressed amplitude 132. Such a suppressed second harmonic amplitude can be significantly lower than a second harmonic amplitude level 134 of a filter (e.g., filter 40 of FIG. 2) without the SAW assembly 120.

Figure 6:
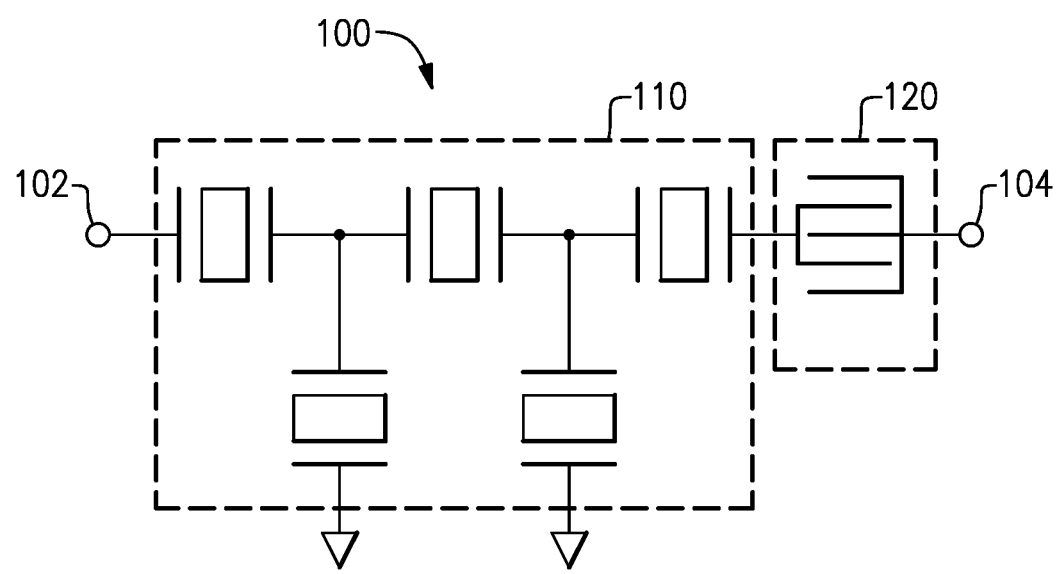
FIG. 6 shows a more specific example of the filter of FIG. 4.

FIG. 6 shows a more specific example of the filter 100 of FIG. 4. In FIG. 6, an example filter 100 is shown to have a BAW assembly 110 that is similar to the filter 40 of FIG. 2. Implemented on one side of the BAW assembly 110 is a SAW assembly 120. Thus, assuming that node 102 is an input node, a signal to be filtered can pass through the BAW assembly 110 to, for example, be band-pass filtered by the BAW assembly 110 about a center frequency of $f_0$. The resulting harmonics such as a second harmonic ($2f_0$) present at the output of the BAW assembly 110 can then be suppressed by the SAW assembly 120.

In some embodiments, the SAW assembly 120 can include one or more SAW resonators electrically arranged in any manner to provide suppression of one or more harmonic frequencies associated with the center frequency of the BAW assembly. Such an arrangement of SAW resonators can include, for example, one or more SAW resonators electrically arranged in series, with or without one or more shunt (SAW) resonators.

In some embodiments, the SAW assembly 120 can be configured to provide a resonance frequency at or close to a harmonic frequency such as a second harmonic frequency $2f_0$. Such a resonance frequency can be utilized to provide, for example, a notch filter functionality to suppress the second harmonic at the frequency $2f_0$.

Figure 7:
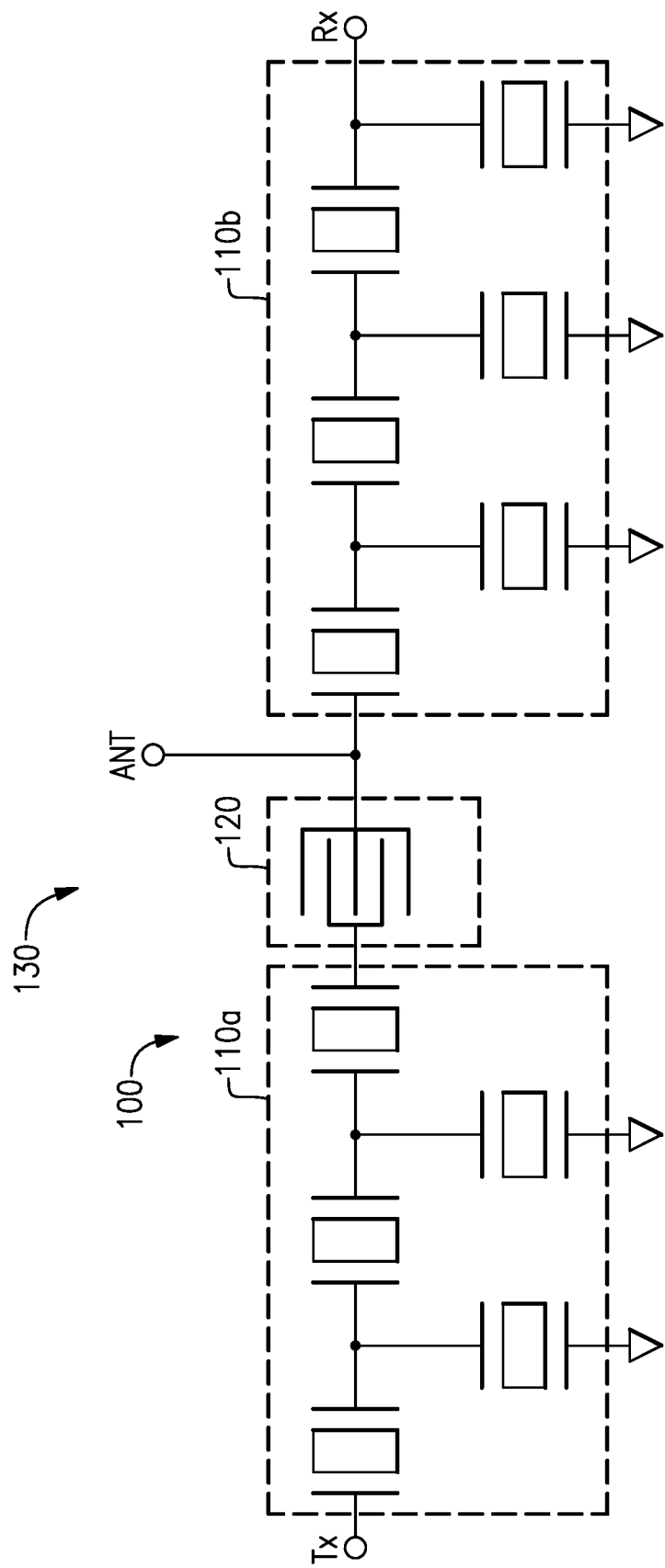
FIG. 7 shows that in some embodiments, a combination of BAW and SAW assemblies can be implemented in a filtering device such as a duplexer.

In the various examples described in reference to FIGS. 2-6, a SAW assembly can be combined with a BAW assembly to provide a desired suppression of one or more harmonics in a filter configuration. FIG. 7 shows that in some embodiments, such a filter configuration having a combination of BAW and SAW assemblies can be implemented in a filtering device such as a duplexer 130.

In the example of FIG. 7, the duplexer 130 is shown to include a BAW assembly 110a implemented to receive a power-amplified signal at a node Tx for transmission through an antenna node ANT. A SAW assembly 120 is shown to be implemented between the BAW assembly 110a and the antenna node ANT. Thus, the resulting combination 100 of the BAW assembly 110a and the SAW assembly 120 can be similar to the example filter 100 of FIG. 6. In the example of FIG. 7, such a filter (100) is shown to be implemented as a transmit filter.

In the example of FIG. 7, the duplexer 130 is shown to further include a BAW assembly 110b implemented to receive a signal from the antenna node ANT and provide a receive filter functionality to provide a filtered receive signal to an output node Rx. In some embodiments, a SAW assembly similar to the transmit filter 100 may or may not be implemented with the BAW assembly 110b.

In the example of FIG. 7, the SAW assembly 120 is shown to be implemented on the output side of the transmit filter 100. Configured in such a manner, one or more harmonics (e.g., second harmonic) resulting from filtering of a power-amplified transmit signal by the BAW assembly 110a can be suppressed by the SAW assembly 120 before reaching the antenna node ANT. If such a harmonic suppressor is not present on the output side of the transmit filter, relatively high amplitude harmonic(s) present at the antenna node ANT can interfere significantly with receive operations on the receive side of the duplexer 130, and/or transmit operations through the antenna node ANT.

Figure 8:
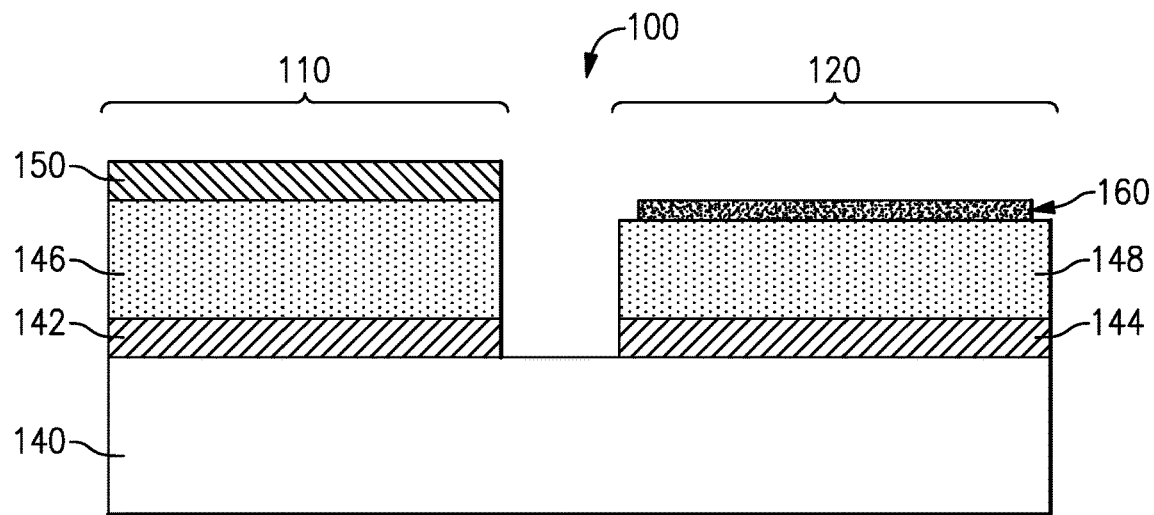
FIG. 8 shows an example of a filter implemented on a common substrate.
Figure 9:
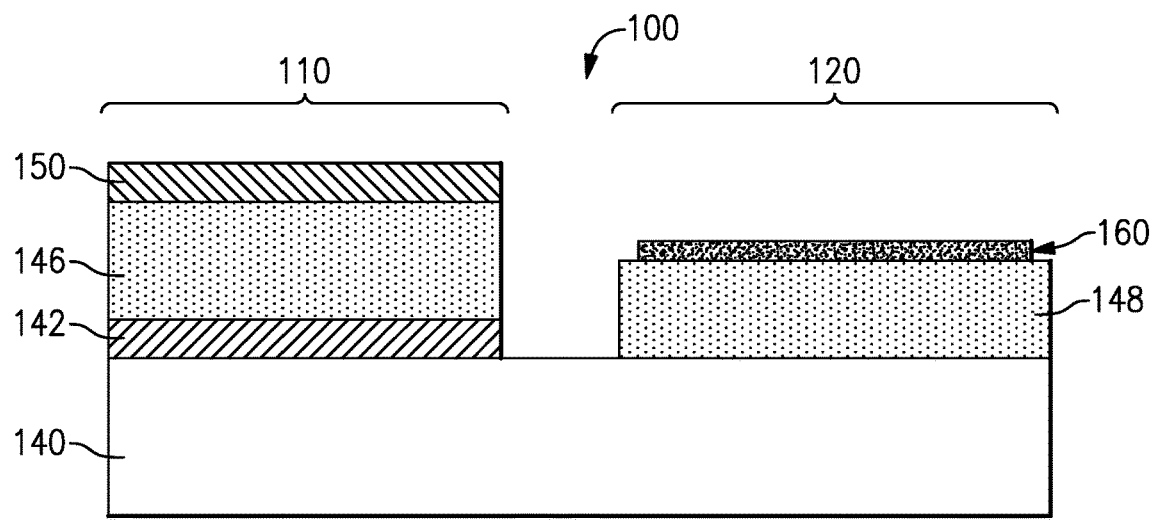
FIG. 9 shows another example of a filter implemented on a common substrate.

FIGS. 8 and 9 show that in some embodiments, a filter 100 having one or more features as described herein can be implemented on a common substrate. For example, a filter 100 in each of FIGS. 8 and 9 can include a substrate 140, a BAW assembly 110 implemented on the substrate 140, and a SAW assembly 120 also implemented on the substrate 140. In each of FIGS. 8 and 9, the BAW assembly 110 can include a piezoelectric material layer 146 between a first electrode (e.g., upper electrode 150) and a second electrode (e.g., lower electrode 142), with the lower electrode 142 being on the upper surface of the substrate 140. It will be understood that the BAW assembly 110 can have one or more of such resonator structures electrically coupled as described herein.

In each of FIGS. 8 and 9, the respective SAW assembly 120 can include a piezoelectric material layer 148 and an interdigital transducer (IDT) structure 160 implemented over the piezoelectric material layer 148. In the example of FIG. 8, such a SAW assembly is shown to be implemented over a metal layer 144. In some embodiments, such a metal layer can be, for example, a patterned portion of the same metal layer as the electrode 142. In some embodiments, the piezoelectric material layer 148 of the SAW assembly 120 can be formed from the same material as the piezoelectric material layer 146 of the BAW assembly 110. In some embodiments, such a piezoelectric material can include, for example, aluminum nitride (AlN). The thickness of the piezoelectric material layer 148 of the SAW assembly 120 may or may not be the same as the thickness of the piezoelectric material layer 146 of the BAW assembly 110. It will be understood that the SAW assembly 120 can have one or more of such SAW resonator structures electrically coupled to provide harmonic suppression functionality as described herein.

In the example of FIG. 9, the SAW assembly 120 is shown to be implemented over the substrate 140 without an intervening metal layer. Referring to FIG. 9, in some embodiments, the piezoelectric material layer 148 of the SAW assembly 120 can be formed from the same material as the piezoelectric material layer 146 of the BAW assembly 110. In some embodiments, such a piezoelectric material can include, for example, aluminum nitride (AlN). The thickness of the piezoelectric material layer 148 of the SAW assembly 120 may or may not be the same as the thickness of the piezoelectric material layer 146 of the BAW assembly 110. It will be understood that the SAW assembly 120 can have one or more of such SAW resonator structures electrically coupled to provide harmonic suppression functionality as described herein.

Figure 10:
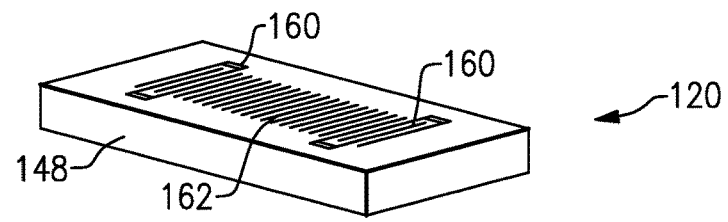
FIG. 10 shows a perspective view of a SAW assembly that can be the SAW assembly in each of FIGS. 8 and 9.

FIG. 10 shows a perspective view of a SAW assembly 120 that can be the SAW assembly in each of FIGS. 8 and 9. More particularly, the SAW assembly 120 is shown to includes a piezoelectric material layer 148 such as an aluminum nitride (AlN) layer, and an interdigital transducer (IDT) structure 160 implemented over the piezoelectric material layer 148. Such an IDT structure can include a plurality of interdigitized metal traces 162 electrically connected respective electrodes. In some embodiments, the IDT structure 160 may or may not be implemented using the same metal as the upper electrode 150 of the respective BAW assembly 110.

For example, some or all of the IDT structure 160 can be formed using the same metal as the upper electrode 150 of the BAW assembly 110. In such an example, formation of the piezoelectric material layer 146 of the BAW assembly 110 and formation of the piezoelectric material layer 148 of the SAW assembly 120 can be achieved during the same deposition/pattern process. Following such a process, formation of the upper electrode 150 of the BAW assembly 110 and formation of the IDT structure 160 of the SAW assembly 120 can be achieved during the same deposition/pattern process.

Figure 11:
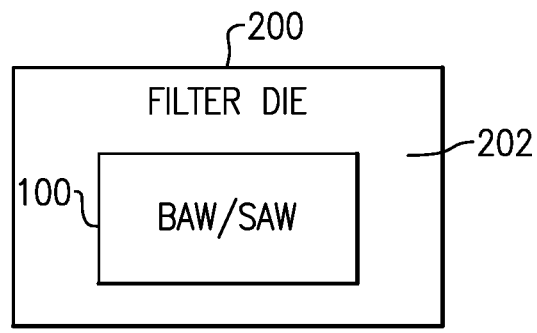
FIG. 11 shows that in some embodiments, a filter having a combination of BAW resonator(s) and SAW resonator(s) as described herein can be implemented as a filter device such as a filter die.

FIG. 11 shows that in some embodiments, a filter 100 having a combination of BAW resonator(s) and SAW resonator(s) as described herein can be implemented as a filter device such as a filter die 200. Such a filter die can include a substrate 202 configured to support the filter 100.

Figure 12:
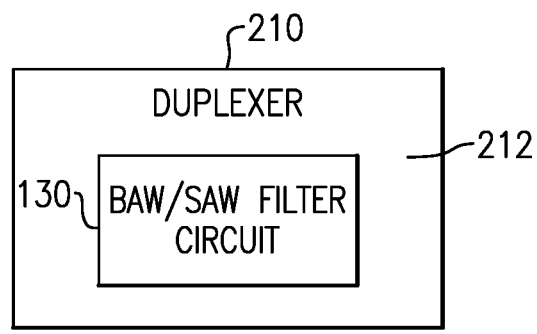
FIG. 12 shows that in some embodiments, a filter circuit having a combination of BAW and SAW resonators as described herein can be implemented as a duplexer device.

FIG. 12 shows that in some embodiments, a filter circuit 130 having a combination of BAW and SAW resonators as described herein can be implemented as a duplexer device 210. Such a duplexer device can include a substrate 212 configured to support the filter circuit 130.

Figure 13:
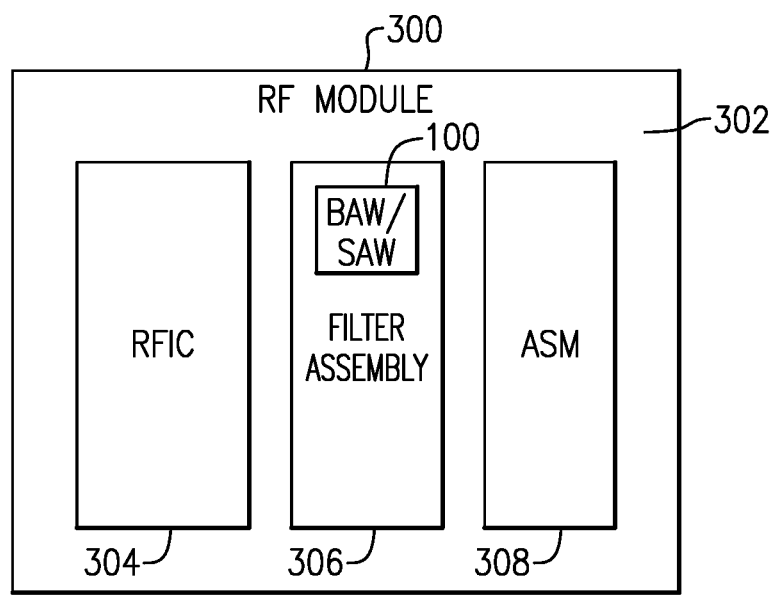
FIG. 13 shows that in some embodiments, a radio-frequency (RF) module can include a BAW/SAW assembly having one or more features as described herein.

FIG. 13 shows that in some embodiments, a radio-frequency (RF) module 300 can include a BAW/SAW assembly 100 having one or more features as described herein. For the purpose of description of FIG. 13, it will be understood that such a BAW/SAW assembly (100) can include the BAW/SAW filter circuit 130 of FIG. 12 implemented to provide a duplexing functionality.

In some embodiments, the RF module 300 of FIG. 13 can include a filter assembly 306, and one or more of the BAW/SAW assemblies 100 can be part of such a filter assembly (306). In some embodiments, the RF module 300 can also include, for example, an RF integrated circuit (RFIC) 304, and an antenna switch module (ASM) 308. Such an example module can be, for example, a front-end module configured to support wireless operations. In some embodiments, some of all of the foregoing components can be mounted on and supported by a packaging substrate 302.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 14:
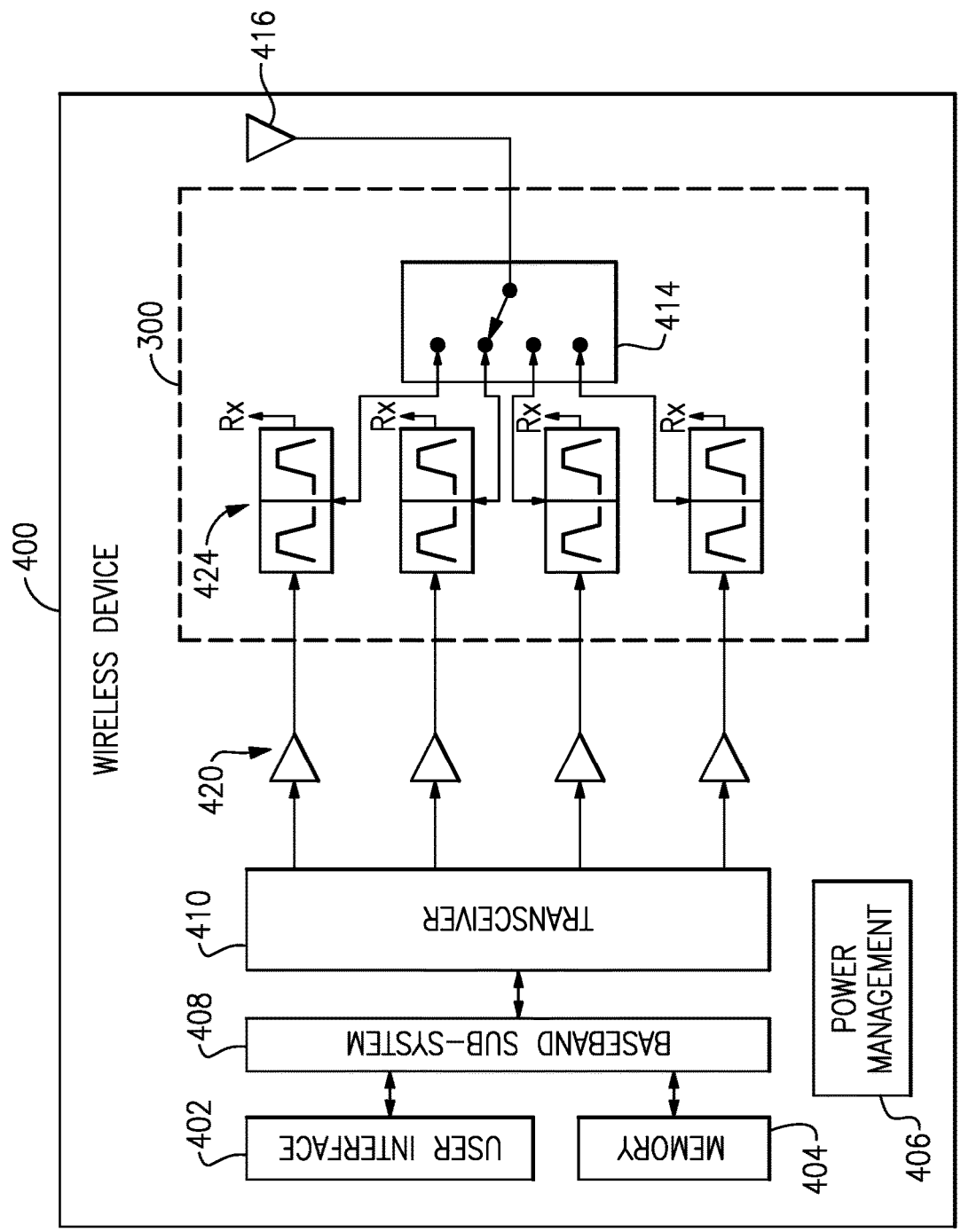
FIG. 14 depicts an example wireless device having one or more advantageous features described herein.

FIG. 14 depicts an example wireless device 400 having one or more advantageous features described herein. In the context of a module having one or more features as described herein, such a module can be generally depicted by a dashed box 300, and can be implemented as, for example, a front-end module (FEM). In such an example, one or more BAW/SAW assemblies as described herein can be included in, for example, an assembly of filters such as duplexers 424.

Referring to FIG. 14, power amplifiers (PAs) 420 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be routed to their respective duplexers 424. Such amplified and filtered signals can be routed to an antenna 416 through an antenna switch 414 for transmission. In some embodiments, the duplexers 424 can allow transmit and receive operations to be performed simultaneously using a common antenna (e.g., 416). In FIG. 14, received signals are shown to be routed to "Rx" paths (not shown) that can include, for example, a low-noise amplifier (LNA).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The invention claimed is:

1. A radio-frequency module comprising:
a packaging substrate;
a die mounted on the packaging substrate and including a radio-frequency integrated circuit; and
a filter device implemented on the packaging substrate and configured to support operation of the radio-frequency integrated circuit, the filter device including a filter substrate and a filter circuit implemented on the filter substrate, the filter device further including a first assembly having one or more bulk acoustic wave (BAW) resonators implemented electrically between an input node and an output node, and configured to filter a signal, the filter device further including a second assembly having one or more surface acoustic wave (SAW) resonators implemented electrically relative to the first assembly, and configured to suppress one or more harmonics resulting from the filtering of the signal by the first assembly.

2. The radio-frequency module of claim 1 wherein the first assembly is configured as a band-pass filter with a frequency band about a center frequency $f_o$.

3. The radio-frequency module of claim 2 wherein the second assembly is configured to suppress a second harmonic having a frequency of $2f_o$.

4. The radio-frequency module of claim 3 wherein the second assembly is configured as a notch filter with a frequency band about the second harmonic frequency $2f_o$.

5. The radio-frequency module of claim 1 wherein the second assembly is implemented electrically between the first assembly and the output node.

6. The radio-frequency module of claim 5 wherein the first assembly includes a series path having a plurality of BAW resonators including the one or more bulk acoustic wave resonators electrically arranged in series between the input node and the second assembly.

7. The radio-frequency module of claim 6 wherein the first assembly further includes one or more additional BAW resonators each electrically arranged as a shunt path between a respective node along the series path and ground.

8. The radio-frequency module of claim 5 wherein the first assembly and the second assembly are configured to support a transmit operation, and the signal is a power-amplified signal.

9. The radio-frequency module of claim 8 wherein the output node is an antenna node.

10. The radio-frequency module of claim 9 further comprising a third assembly having one or more bulk acoustic wave (BAW) resonators implemented electrically between the antenna node and a receive node, and configured to filter a received signal from the antenna node.

11. The radio-frequency module of claim 10 wherein the first assembly and the third assembly are configured to provide duplexing functionality.

12. A wireless device comprising:
an antenna; and
a front-end system in communication with the antenna through an antenna node, and including a filter circuit having an input node and an output node, the filter circuit further including a first assembly having one or more bulk acoustic wave (BAW) resonators implemented electrically between the input node and the output node, and configured to filter a signal, the filter circuit further including a second assembly having one or more surface acoustic wave (SAW) resonators implemented electrically relative to the first assembly, and configured to suppress one or more harmonics resulting from the filtering of the signal by the first assembly.

13. The wireless device of claim 12 wherein the filter circuit is implemented as a duplexer.

14. The wireless device of claim 13 wherein the one or more BAW resonators is/are implemented as a transmit filter configured to filter a power-amplified signal.

15. The wireless device of claim 14 wherein the duplexer further includes a receive filter having one or more BAW resonators, such that the transmit filter is between the input node and the output node that is coupled to the antenna node, and the receive filter is between the antenna node and a receive node.

16. The wireless device of claim 15 wherein the one or more SAW resonators of the second assembly is/are implemented between the output node of the transmit filter and the antenna node to suppress the one or more harmonics resulting from the filtering of the power-amplified signal.

17. The wireless device of claim 16 wherein the one or more harmonics resulting from the filtering of the power-amplified signal includes a second harmonic.

18. The wireless device of claim 12 wherein each BAW resonator of the one or more BAW resonators includes a piezoelectric material layer implemented between a lower electrode and an upper electrode.

19. The wireless device of claim 12 wherein each SAW resonator of the one or more SAW resonator includes a piezoelectric material layer implemented over a substrate, and an interdigital transducer structure implemented over the piezoelectric material layer.

\* \* \* \* \*